United States Patent
Dalla Piazza et al.

(10) Patent No.: US 11,146,239 B2
(45) Date of Patent: Oct. 12, 2021

(54) SMALL PIEZOELECTRIC RESONATOR

(71) Applicant: Micro Crystal SA, Grenchen (CH)

(72) Inventors: Silvio Dalla Piazza, St-Imier (CH);
Felix Staub, Koppigen (CH)

(73) Assignee: Micro Crystal SA, Grenchen (CH)

(*) Notice: Subject to any disclaimer, the term of this patent is extended or adjusted under 35 U.S.C. 154(b) by 596 days.

(21) Appl. No.: 16/136,320

(22) Filed: Sep. 20, 2018

(65) Prior Publication Data
US 2019/0103854 A1 Apr. 4, 2019

(30) Foreign Application Priority Data

Oct. 3, 2017 (EP) .................................. 17194584

(51) Int. Cl.
| | |
|---|---|
| *H03H 9/215* | (2006.01) |
| *H03H 9/19* | (2006.01) |
| *H03H 9/05* | (2006.01) |
| *H01L 41/04* | (2006.01) |
| *H03H 9/21* | (2006.01) |
| *H03H 3/04* | (2006.01) |
| *G04C 3/12* | (2006.01) |

(52) U.S. Cl.
CPC ............ *H03H 9/215* (2013.01); *H01L 41/04* (2013.01); *H03H 9/0542* (2013.01); *H03H 9/19* (2013.01); *H03H 9/21* (2013.01); *G04C 3/12* (2013.01); *H03H 2003/0492* (2013.01)

(58) Field of Classification Search
CPC ........ H03H 9/215; H03H 9/19; H03H 9/0542; H03H 9/21; H03H 2003/0492; H01L 41/04; G04C 3/12

See application file for complete search history.

(56) References Cited

U.S. PATENT DOCUMENTS

| | | | | |
|---|---|---|---|---|
| 7,535,159 | B2* | 5/2009 | Kizaki | ..................... H03H 3/04 310/370 |
| 7,626,318 | B2 | 12/2009 | Dalla Piazza et al. | |
| 8,102,103 | B2* | 1/2012 | Furuhata | ................ H03H 9/215 310/370 |
| 8,400,049 | B2 | 3/2013 | Yang et al. | |
| 8,933,614 | B2* | 1/2015 | Staub | ....................... H03H 9/21 310/370 |
| 9,344,057 | B2* | 5/2016 | Sakamoto | ................ H03H 9/21 |
| 2009/0021120 | A1 | 1/2009 | Dalla Piazza et al. | |
| 2009/0066194 | A1* | 3/2009 | Yamamoto | ............. H03H 9/215 310/365 |

(Continued)

OTHER PUBLICATIONS

European Search Report dated Mar. 12, 2018 in European Application 17194584.3, filed Oct. 3, 2017 (with English Translation of Categories of cited documents).

*Primary Examiner* — J. San Martin
*Assistant Examiner* — Jaydi San Martin
(74) *Attorney, Agent, or Firm* — Oblon, McClelland, Maier & Neustadt, L.L.P.

(57) ABSTRACT

The invention relates to a piezoelectric resonator, which comprises a base and at least two vibrating arms (3) extending from the base, at least two grooves (4a, 4b) being formed opposite each other on part of the length of the arms and on upper and lower faces of the arms. The depth of the groove on the upper face is less than 30% of the total thickness of each arm and the depth of the groove on the lower face is more than 50% of the total thickness of each arm, or reversely.

18 Claims, 7 Drawing Sheets

(56) References Cited

U.S. PATENT DOCUMENTS

| | | | |
|---|---|---|---|
| 2009/0115294 A1* | 5/2009 | Kikushima | H01L 41/04 310/370 |
| 2010/0277041 A1* | 11/2010 | Yamazaki | H03H 9/19 310/367 |
| 2011/0063041 A1* | 3/2011 | Yamada | H03H 9/1021 331/158 |
| 2011/0115342 A1* | 5/2011 | Yang | H01L 41/04 310/365 |
| 2013/0175903 A1 | 7/2013 | Staub et al. | |
| 2015/0114126 A1* | 4/2015 | Matsuo | G01C 19/5607 73/651 |

* cited by examiner

SMALL PIEZOELECTRIC RESONATOR

This application claims priority from European Patent Application No. 17194584.3 filed on Oct. 3, 2017, the entire disclosure of which is hereby incorporated herein by reference.

TECHNICAL FIELD

The invention relates to a small piezoelectric resonator. This piezoelectric resonator can be a quartz tuning fork resonator intended to be used in conjunction with at least one electronic circuit in the field of horology, computing, telecommunications and even medicine.

TECHNOLOGICAL BACKGROUND

In a conventional piezoelectric tuning fork resonator, an electric excitation field is created by electrodes in a direction parallel to one of the faces, with some of said electrodes being disposed on this face. Such a resonator comprises a base and two vibrating arms that are generally parallel to each other and extend from the base in the same direction.

Figure 1:
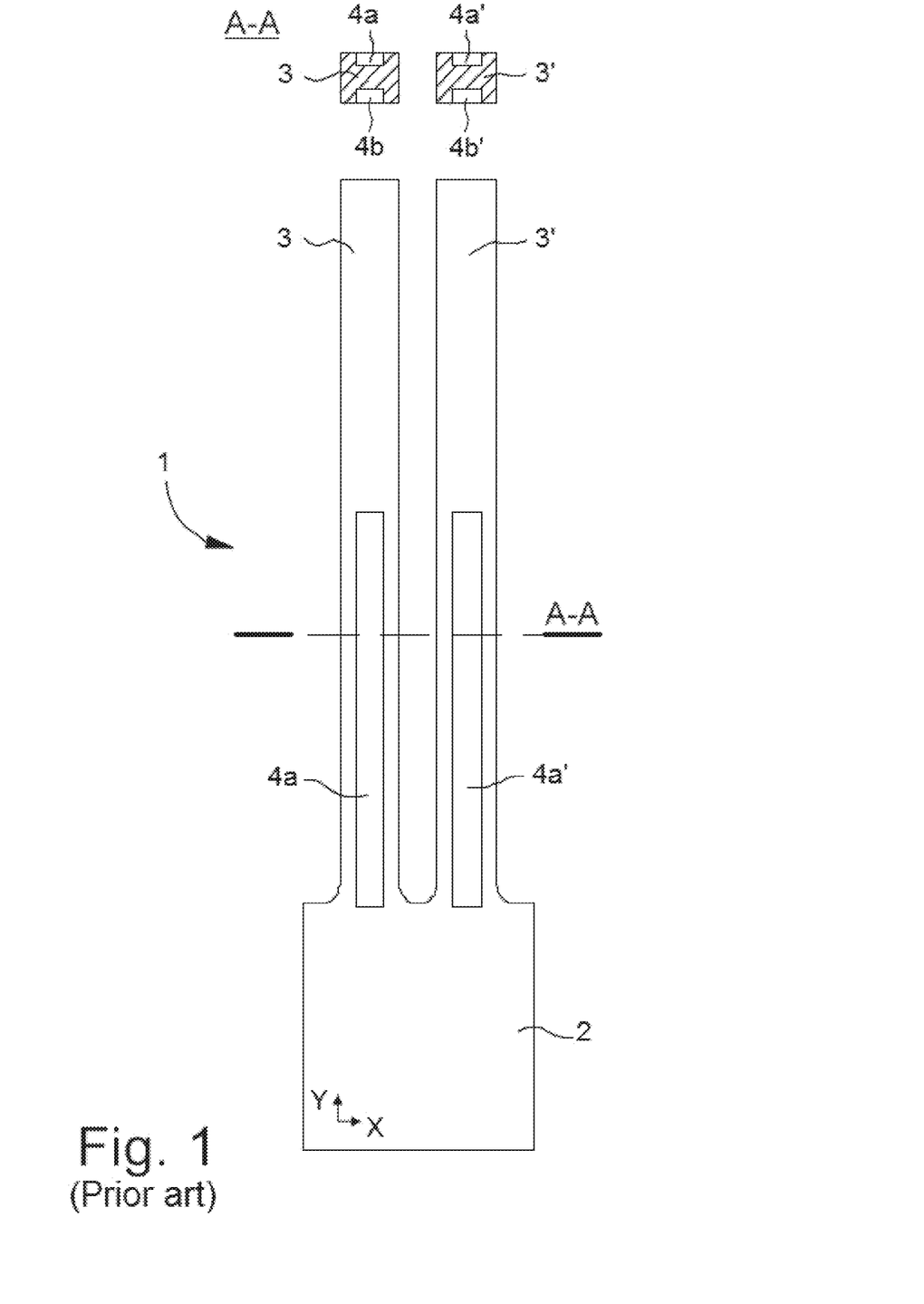
FIG. 1, already described, shows a top view of a piezoelectric tuning fork resonator having symmetrical grooves on its arms, according to the prior art.

As such, patent FR 2 467 487 can be cited, which discloses a piezoelectric tuning fork resonator. As shown in FIG. 1, this resonator 1 comprises a base 2 and two vibrating arms 3, 3' extending from the base. At least one groove 4a, 4a', 4b, 4b' is produced on a lower face and/or on an upper face of each arm 3, 3'. These arms have an H-shaped transverse section with grooves 4a, 4a', 4b, 4b' that are the same depth in order to provide a symmetrical arrangement. With an electrode arrangement, not shown and partly disposed in the symmetrical grooves of the arms, this allows power consumption to be reduced by virtue of a more homogenous excitation by an electric field. However, the quality factor is not sufficiently improved.

In order to further reduce the dimensions of such a piezoelectric tuning fork resonator, as disclosed in U.S. Pat. No. 6,587,009 B2, the production of notches on the base of the resonator is envisaged in order to allow mechanical decoupling of a zone for fixing the resonator in its casing and the vibrating arms fixed on another side of the base. Furthermore, grooves are also produced on each of the arms of the resonator. Primarily, a groove is produced on an upper face and a groove is produced on a lower face of each arm, the two grooves being opposite each other. The depth of the grooves is between 30% and 50% of the total thickness of each arm. These arms also have an H-shaped transverse section and a symmetrical shape to the detriment of asymmetry due to chemical etching. However, with such an arrangement of the grooves in each arm of the resonator, the quality factor of said resonator has to be optimized by making grooves of the two faces with different depth.

Patent application US 2010/0277041 A1 discloses a piezoelectric resonator with two parallel arms extending from a base. Each arm comprises two parallel grooves produced side-by-side over the length of each arm. A first groove is produced from a first face and the depth thereof is more than 50% of the thickness of the arm, whereas a second groove is produced from a second opposite face and the depth thereof is more than 50% of the thickness of the arm. The grooves are arranged in a symmetrical and parallel manner over the length. To pass the two grooves side-by-side, the width of the grooves is limited, which is not favourable concerning the ratio between width and depth of the grooves for small arms.

U.S. Pat. No. 7,626,318 B2 and patent application US 2013/0175903 A1 also disclose a piezoelectric resonator with at least two parallel arms extending from a base. A groove on a top face and a groove on a bottom face are produced in each arm, but with the same depth and thus in a symmetrical shape. The quality factor of the resonator has to be optimized by making grooves of the two faces with different depth.

A primary aim of the present invention is to allow the quality factor of the tuning fork resonator to be improved without complicating the production of such a small resonator.

SUMMARY OF THE INVENTION

Therefore, the aim of the invention is to propose a small piezoelectric resonator in order to overcome the disadvantages of the aforementioned prior art, in order to improve the quality factor of the resonator without complicating the production of such a resonator.

To this end, the invention relates to a piezoelectric resonator comprising a base and at least two vibrating arms connected to the base in a direction of a crystalline axis X, wherein the vibrating arms extend from the base in a direction of a crystalline axis +Y or −Y, wherein at least a first groove is formed on an upper face on a side +Z of each arm along the crystalline axis +Y or −Y on part of the length of the arms and wherein at least a second groove is formed on a lower face on a side −Z of each arm along the crystalline axis +Y or −Y on part of the length of the arms and opposite the first groove in an asymmetrical arrangement, wherein the depth of the first groove is less than 30% of the total thickness of each arm or more than 50% of the total thickness of each arm, and wherein the depth of the second groove is more than 50% of the total thickness of each arm if the depth of the first groove is less than 30% of the total thickness of each arm, or less than 30% of the total thickness of each arm if the depth of the first groove is more than 50% of the total thickness of each arm.

Embodiments of the piezoelectric resonator are defined in dependent claims 2 to 18.

An advantage of the piezoelectric resonator resides in the fact that each arm comprises at least one groove on a lower face and/or one groove on an upper face, the depth of which is less than 30% of the thickness of each arm or more than 50% of the thickness of each arm.

Advantageously, two grooves are produced opposite each other on the lower face and on the upper face of each arm. The depth of the first groove on one side is less than 30% of the thickness of each arm and the depth of the second groove on another side is more than 50%, even at least 65%, of the thickness of each arm, which provides two asymmetrical grooves.

Advantageously, by selecting appropriate surfaces for producing the deep and shallow grooves relative to the crystalline orientation of the resonator, the quality factor Q of the resonator proved to be improved compared to the case of symmetrical grooves, in particular. By virtue of this improvement, this allows the quality factor to be increased by nearly 15% compared to a resonator of the prior art.

BRIEF DESCRIPTION OF THE DRAWINGS

The aims, advantages and features of the piezoelectric resonator will become more clearly apparent throughout the following description, with reference to the drawings, in which.

DETAILED DESCRIPTION OF THE INVENTION

Throughout the following description, all the parts of the piezoelectric resonator, which are well-known to a person skilled in the art in this technical field, will not be explained in detail. It is also to be noted that the following description is provided for a quartz piezoelectric tuning fork resonator capable of primarily oscillating in a basic bending mode. The definition of the crystalline axes and of the signs of the elastic coefficients are in accordance with standard IEC 60758. Consequently, the following description is equally applicable to a right-hand quartz and to a left-hand quartz.

The piezoelectric resonator 1 of the present invention comprises, as shown in FIG. 1 of the prior art, a base 2 and two vibrating arms 3, 3' connected to the base 2 in a direction of a crystalline axis X and extending from the base in a direction of a crystalline axis Y or −Y. The orientation of the main axes of the resonator can deviate from the crystalline axes by several degrees without detracting from the described effects. Such rotations of the section are applied, for example, in order to adjust the thermal behaviour of the resonator. The piezoelectric resonator 1 preferably is a tuning fork resonator with two arms 3, 3' capable of vibrating in order to generate an oscillation.

The two arms are generally disposed from the base 2 partly parallel to each other and, for example, are of similar shape and size. At least one groove 4a, 4a', 4b, 4b' is produced in a direction of a crystalline axis Z on each arm 3, 3' from a lower face and/or an upper face of each arm. Preferably, a groove 4a, 4a' is produced on the upper face of the two arms 3, 3' and a groove 4b, 4b' is produced on the lower face of the two arms 3, 3'. The two grooves produced in each arm are disposed opposite each other, but they have different depths in order to form asymmetrical grooves.

The upper face of each arm 3, 3' can be in the extension of an upper face of the base 2, whereas the lower face of each arm 3, 3' can be in the extension of a lower face of the base 2. Connection terminals connected to electrodes, which are disposed on faces of the arms and are not shown, are disposed on the lower face of the base 2. These connection terminals are conventionally fixed on a connection support step when the resonator is assembled in a casing of the electronic component. However, it is also possible to contemplate the thickness of the base 2 being less than or more than the thickness of each arm 3, 3', which is connected to the base 2.

Figures 6A, 6B:
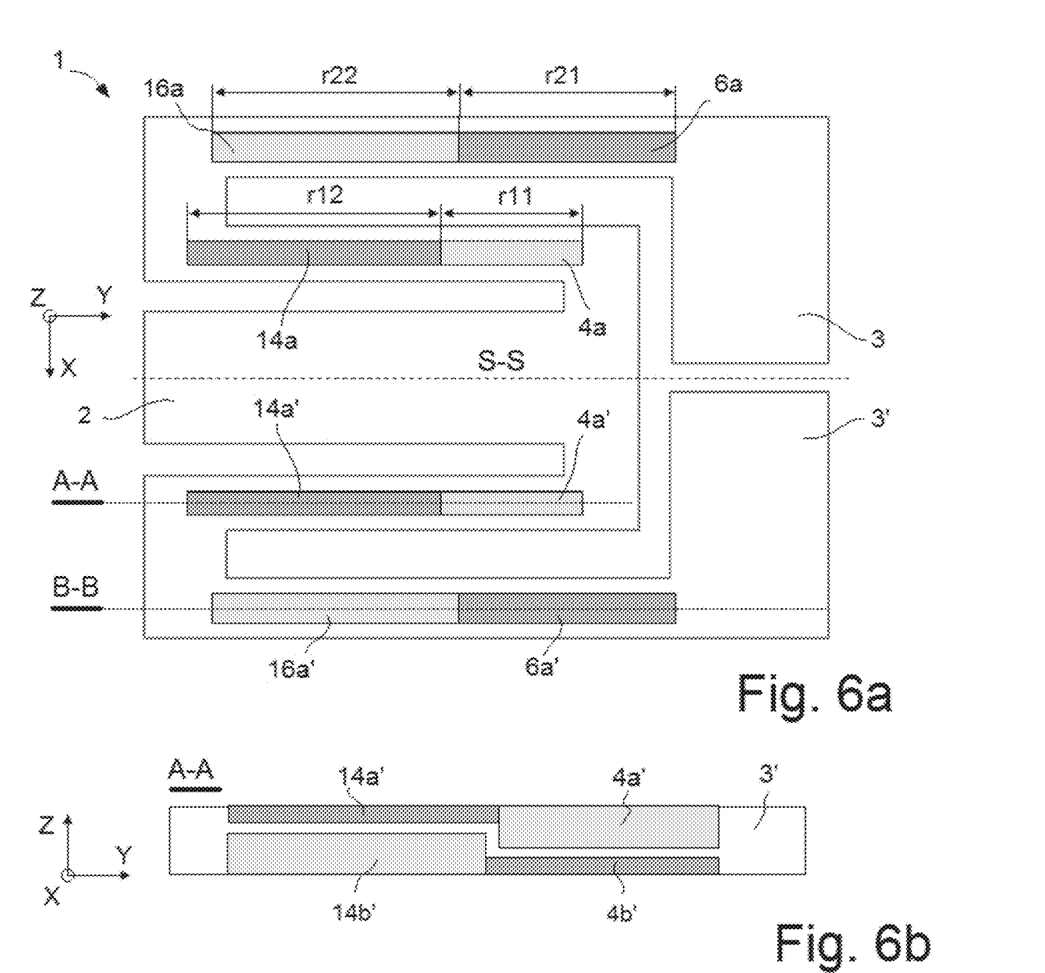
FIGS. 6a to 6c show a top view and two longitudinal sections A-A and B-B of arm portions on another embodiment similar to the embodiment shown in FIG. 4g of the piezoelectric resonator with grooves on each arm according to the invention.

The arrangement of the electrodes on the arms can be identical to the arrangement described in paragraph 32 and shown in FIG. 6A in patent EP 1 633 042 B1.

Figure 2A:
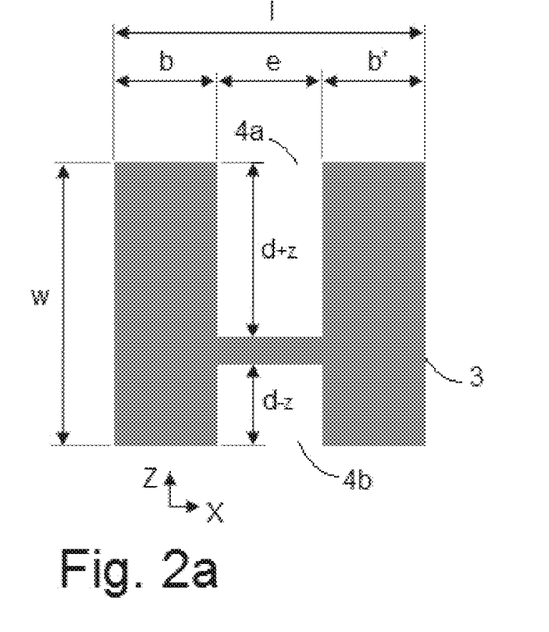
FIGS. 2a and 2b show, according to two embodiments, a transverse section of one of the arms of the piezoelectric tuning fork resonator according to the invention, showing the depth of the grooves on each arm.
Figure 2B:
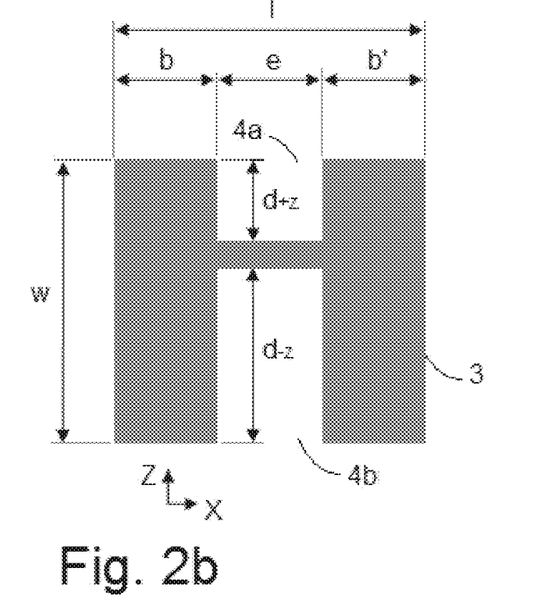

As shown in FIGS. 2a and 2b, the depth $d_{+z}$ of the groove 4a on the upper face of each arm 3 can differ from the depth $d_{-z}$ of the groove 4b on the lower face of each arm 3. A difference in depth $r = d_{-z} - d_{+z}$ can be determined. With two asymmetrical grooves, the depth of a first groove 4a is less than 30% of the thickness w of each arm 3, whereas the depth of a second groove 4b is more than 50%, or vice versa.

According to a first variation, shown in FIG. 2a, the depth $d_{-z}$ is less than the depth $d_{+z}$, which provides the difference in depth r<0 for asymmetrical grooves. According to a second variation, shown in FIG. 2b, the depth $d_{-z}$ is more than the depth $d_{+z}$, which provides the difference in depth r>0 for asymmetrical grooves. The greatest depth in FIGS. 2a and 2b must be more than 50% of the total thickness of the arm and preferably close to 65%, whereas the lowest depth must be less than 30% of the total thickness of the arm and preferably close to 25%. It is also possible to contemplate having a maximum groove depth on one side that is 70% of the thickness of the arm and on the other side that is 28% of the thickness of the arm.

Figure 5:
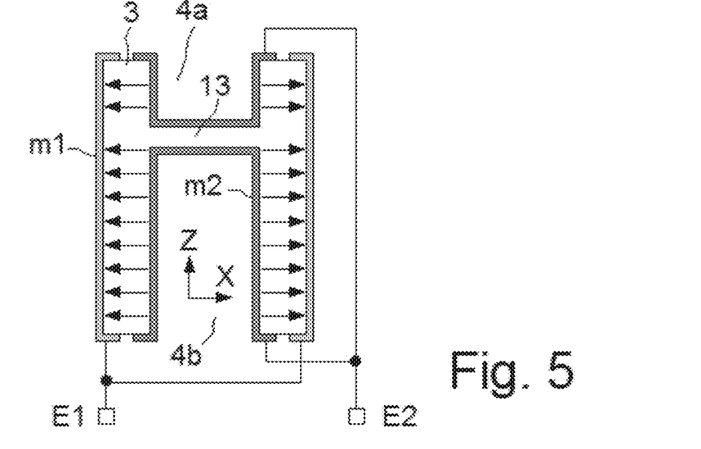
FIG. 5 schematically shows a transverse section of an arm of the piezoelectric resonator with an arrangement of the electrodes, in order to explain the operation of the piezoelectric resonator with asymmetrical grooves according to the invention.

Under these conditions, it is particularly advantageous for the bottom wall 13 to be thin, as shown in FIG. 5, which wall also connects the deep groove and the shallow groove in order to attenuate the transfer of stress during the compression of one side and the extension of the other side. This allows the transfer of heat between the two sides to be attenuated and thus allows low thermoelastic damping to be obtained.

The grooves 4a, 4a', 4b and 4b' of width e produced on the upper face and on the lower face of each arm 3, 3' are preferably centrally located between two edges or lateral walls b, b' of each arm with the same width or with a different width. Solely by way of a non-limiting example, the width l of each arm can be approximately 52 μm, whereas the thickness w can be approximately 108 μm. Each edge or lateral wall b, b' can be approximately 5 μm, which means that the width e of each groove can be approximately 42 μm. The length of each groove can be approximately 700 μm, starting from the edge of the base 2. The width of the base 2 can be approximately 170 μm and the length of the base in the direction of the arms can be approximately 770 μm. The length of each arm can be approximately 1160 μm and the space between the two arms can be approximately 330 μm.

In general, the length of each groove along each arm can be between 5% and 100% of the length of each arm and the width of each groove can be between 40% and 90% of the width of each arm, for example.

A material other than quartz can be used to produce the piezoelectric resonator. A material such as AlPO4, GaPO4, GaAsO4, can be used; however, it is to be noted that the geometrical dimensions and the orientation of the first and second grooves relative to the crystalline axes can differ from the situation described for quartz, since they depend on the elastic coefficients of the material, and in particular on the coefficient c14, which must have a negative sign with reference to standard IEC 60758 for the orientations of the described resonator.

The difference in depth of the transverse sections of one of the arms of FIGS. 2a and 2b is thus shown for an arm extending in the direction +Y (hereafter referred to as orientation (X, +Y)). If the orientation of the arms shown in FIG. 1 is changed in the direction −Y according to the crystalline orientation (hereafter referred to as orientation (X, −Y)), the deep groove in FIGS. 2a and 2b changes side.

Due to the anisotropic nature of crystalline quartz, if the arms of the resonator have a symmetrical profile, this generates a spatial torsional component about the axis Y, which superimposes on the bending mode in the direction X. This torsional component can be suppressed or promoted by breaking the symmetry of the profile of the beam (arm). Among other means, and as shown above, this can be carried out by changing $r=d_{-z}-d_{+z}$ into different values of 0, as shown in FIGS. 2a and 2b, where $d_{-z}$ is the depth of the groove 4b, 4b' on the lower face (side −Z) of each arm 3, 3' relative to the thickness of each arm, and $d_{+z}$ is the depth of the groove 4a, 4a' on the upper face (side +Z) relative to the thickness of each arm.

Figure 3:
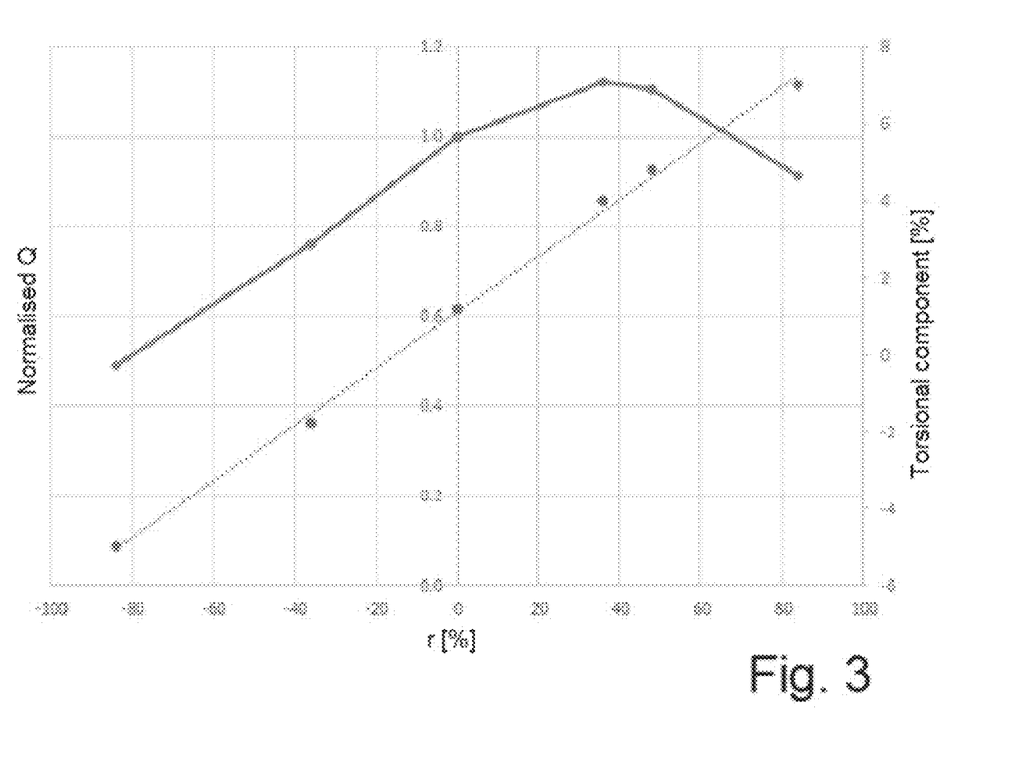
FIG. 3 shows a graph of the normalised quality factor Q as a "solid line curve", reference to the scale at the centre, as well as the torsion component as a function of the difference in depth of the grooves between the lower face and the upper face of each arm, shown as a "dashed line curve", reference to the scale to the right.

As shown in FIGS. 2a and 2b, digital studies have shown that the quality factor Q decreases for r<0 and increases for r >0 for the crystalline orientation (X, +Y) of the resonator. At this value of r >0, the quality factor will reach a maximum and will again decrease even if r is greater. In FIG. 3, the normalised quality factor Q is shown as a solid line dependent on r. This quality factor Q is seen as having a peak around r=0.4, which corresponds to $d_{-z}$ approximately at 65% and $d_{+z}$ approximately at 25%. The value of r, at which the maximum of the quality factor Q is reached, depends on the precise geometry of the profile of the arms, and specifically on the width of each edge b, b' between the groove of width e and the lateral wall of the arm.

The observed behaviour can be explained by the generation of a torsion component shown along the dashed line in FIG. 3 and superimposed on the bending mode, which modifies the distribution of the stress in the arms of the resonator. This results in a reduction in the thermoelastic damping for r >0, which thus increases the quality factor Q at least to the value r=40%.

Various shapes of the piezoelectric resonator 1 are shown in FIGS. 4a to 4g, in which the shape of the arms and the grooves is modified, whilst keeping the depth of one of the grooves 4a, 4a' lower than the depth of the other opposite groove, not shown. According to the crystalline orientation (X, +Y), the depth of the grooves 4a and 4a' on the upper face is nearly 25% of the thickness of the arm, whereas the depth of the grooves on the lower face is nearly 65% of the thickness of the arm. These grooves, with the depths, as shown in FIGS. 2a and 2b, are found in each embodiment of the resonator shown in FIGS. 4a to 4g.

Figure 4A:
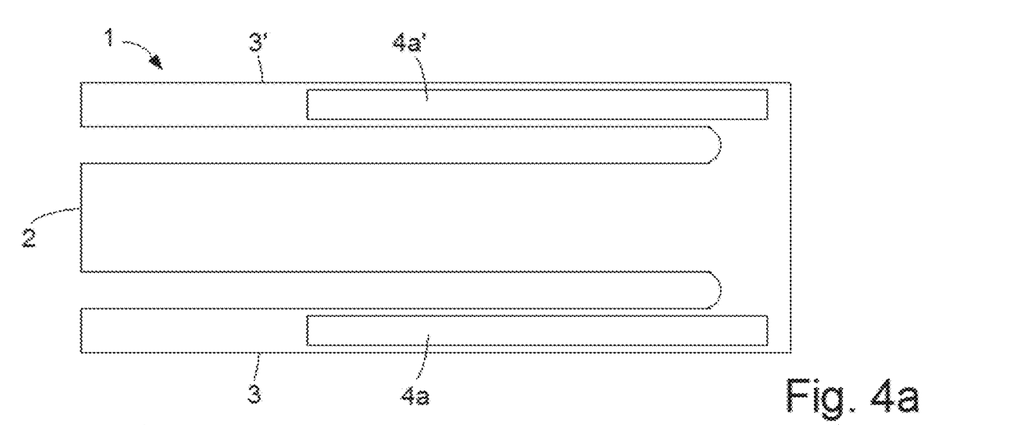
FIGS. 4a to 4g show a top view of various shapes of the piezoelectric resonator with grooves on each arm with different depths, as shown in FIGS. 2a and 2b.

FIG. 4a shows a top view of a piezoelectric resonator 1 with the two vibrating arms 3, 3' connected to the base 2 by means of a connection part. The base 2 is located between the two vibrating arms 3, 3' and parallel to the two arms 3, 3'. Each arm 3, 3' comprises a groove 4a, 4a' on the upper face and a groove on the lower face, not shown, and opposite the groove on the upper face. The grooves are produced on part of the length of each arm and extend from the connection part to the base 2.

Figure 4B:
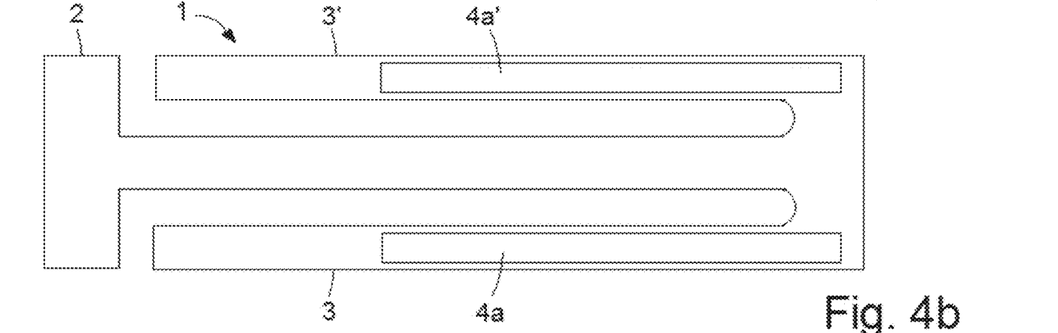

FIG. 4b shows a top view of a piezoelectric resonator 1 with the two vibrating arms 3, 3' connected to the base 2 by means of a connection part. This piezoelectric resonator is similar to that shown in FIG. 4a, with the same arrangement of the grooves 4a, 4a', except that the base 2 further comprises an end part for fixing an opposite side to the part for connecting the arms 3, 3' to the base 2. In this case, the base 2 is longer than the arms 3, 3'.

Figure 4C:
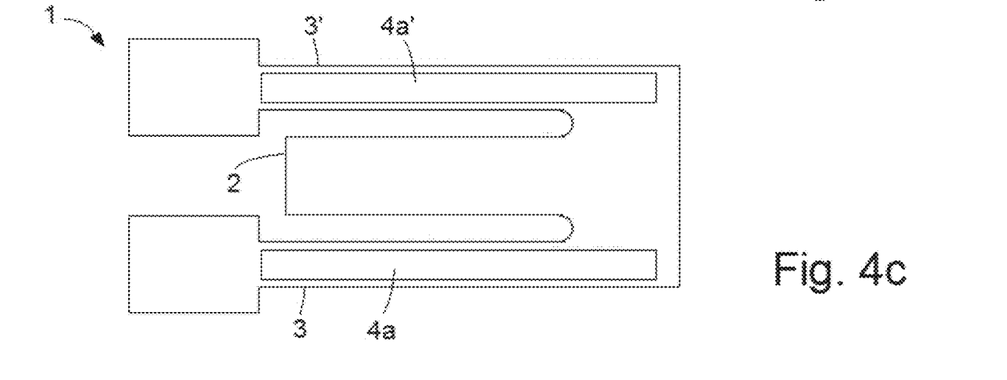

FIG. 4c shows a top view of a piezoelectric resonator 1 with the two vibrating arms 3, 3' connected to the base 2 by means of a connection part. This piezoelectric resonator is similar to that shown in FIG. 4a or in FIG. 4b, with the same arrangement of the grooves 4a, 4a'. Unlike the embodiments shown in FIGS. 4a and 4b, the length of the base 2 is shorter than the length of the vibrating arms 3, 3'. Each arm 3, 3' ends at an opposite side to the part for connecting the arms 3, 3' to the base 2 with a symmetrical rectangular shaped fin.

Figure 4D:
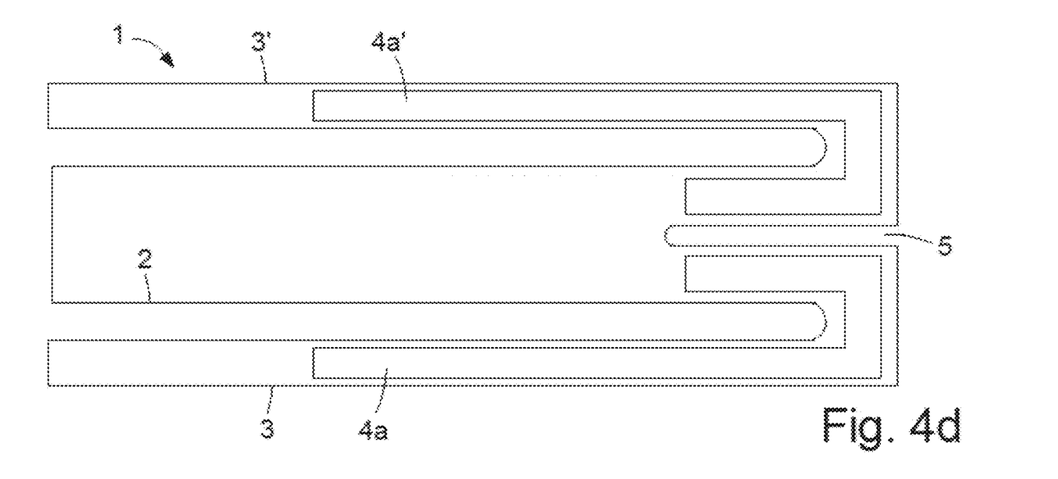

FIG. 4d shows a top view of a piezoelectric resonator 1 with the two vibrating arms 3, 3' connected to the base 2 by means of a connection part. The general shape of the resonator corresponds to that of the resonator shown in FIG. 4a. The connection part further comprises a slot 5 in the direction Y. This has the effect of widening the two arms 3, 3' connected to the base 2, whilst keeping said resonator small. A groove 4a, 4a' on the upper face and a groove on the lower face of each arm are provided by also extending over the connection part to the base 2. Viewed from above each groove is U-shaped.

Figure 4E:
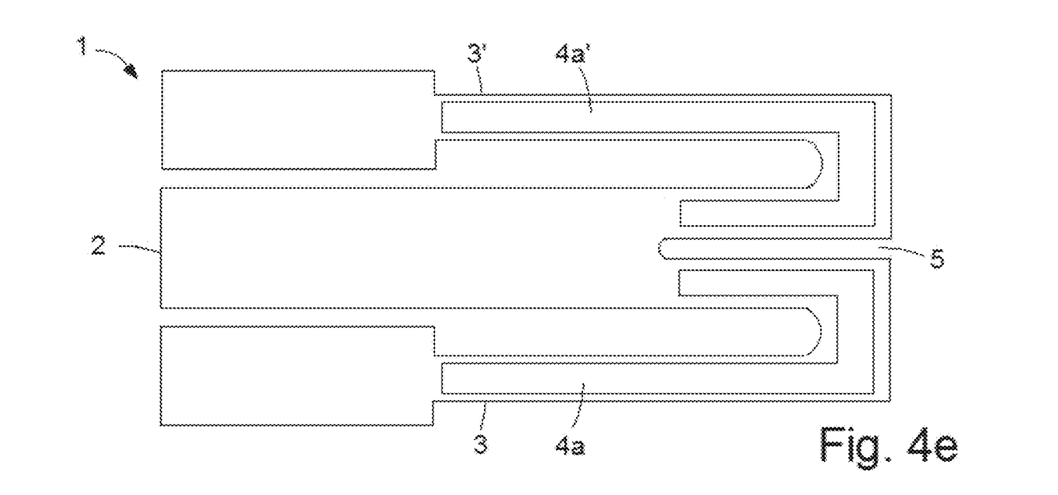

FIG. 4e shows a top view of a piezoelectric resonator 1 with the two vibrating arms 3, 3' connected to the base 2 by means of a connection part. This embodiment is similar to that shown in FIG. 4d except that it is also provided with a fin at the end of each arm 3, 3' terminating at a side opposite the part for connecting the arms 3, 3' to the base 2. Each fin can have, for example, a symmetrical rectangular shape or another shape, not shown, without a specific limitation to this featured shape.

Figure 4F:
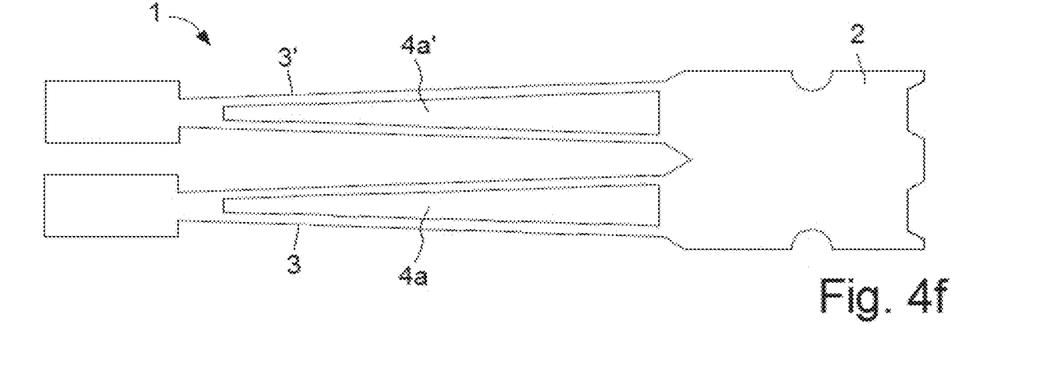

FIG. 4f shows a top view of a piezoelectric resonator 1 with two vibrating arms 3, 3' connected to the base 2 in like manner to that shown in FIG. 1. However, the width of each of the two arms 3, 3', which width continuously linearly decreases from the base 2 and up to its free end, also terminates with a rectangular and symmetrical shaped fin. The width of each groove 4a, 4a' produced on the upper face and on the lower face of each arm 3, 3' also continuously linearly decreases from the base 2 and up to part of the arm before each fin. Of course, the depth of the grooves 4a, 4a' on the upper face differs from the depth of the grooves on the lower face. Furthermore, the depth of the grooves 4a, 4a' decreases from the base 2 to the free end of each arm 3, 3', whilst keeping one of the grooves at a depth that is less than 30% of the thickness of the arm and the other one of the grooves at a depth that is more than 50% of the thickness of the arm. Slots also can be provided in the base 2 to improve the mechanical decoupling between the vibrating arms 3, 3' and the fixed part of the base 2.

Figure 4G:
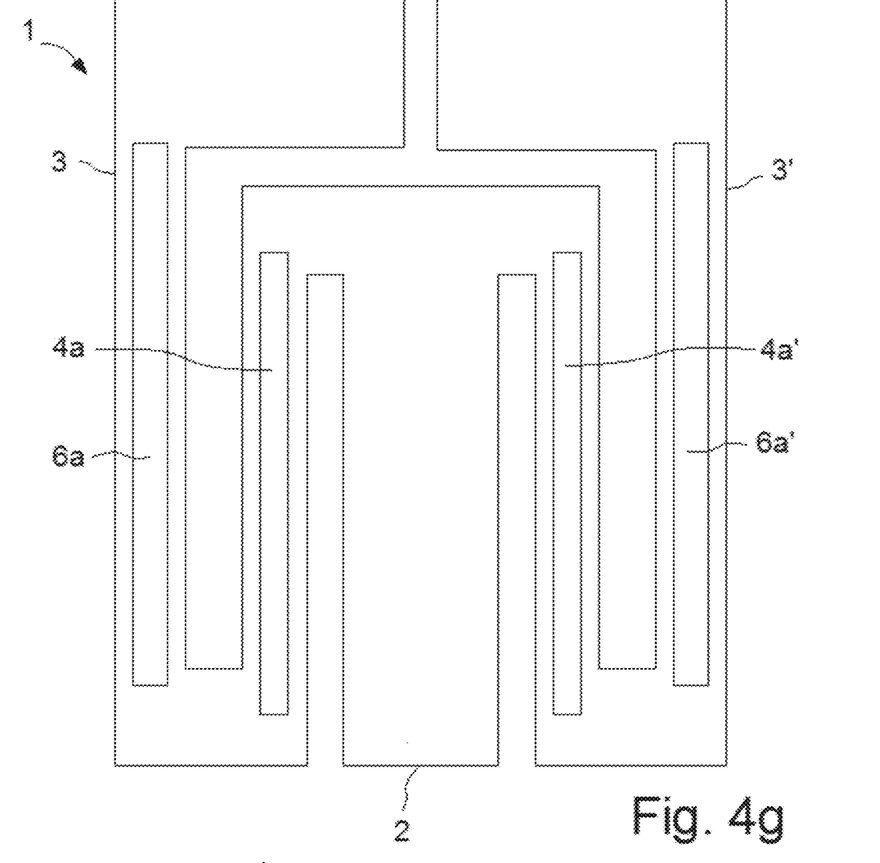

FIG. 4g shows a top view of a piezoelectric resonator 1 with the two vibrating arms 3, 3' connected to the base 2 by means of a connection part, as partly shown in FIG. 4a. Each arm 3, 3' comprises a first elongated portion connected to the base by a connection part. The first elongated portion is parallel to the base 2 and extends over the entire length of the base 2. Each arm 3, 3' further comprises a second elongated portion parallel to the first portion that is connected to the first elongated portion by a transverse part. The second portion of each arm 3, 3' terminates with a rectangular shaped fin, which symmetrically extends towards the base 2 and is parallel to the connection part. A first groove 4a, 4a' is produced on the upper face of the first portion of each arm 3, 3' and a third groove 6a, 6a' is produced on the upper face of the second portion of each arm 3, 3'. Second and fourth grooves are also produced on the lower face of the first and second portions of each arm 3, 3', and respectively opposite first and third grooves produced from the upper face. The depth of first and third grooves 4a, 4a', 6a, 6a' can be identical or different, and it is the same case for second and fourth grooves.

It is also to be noted that in the embodiments shown in FIGS. 4a to 4g, it is also possible to contemplate having each arm with two small parallel grooves on each upper and lower face, whilst providing a groove 4a, 4a' on the upper face with a different depth from the depth of the groove on the lower face.

FIG. 5 schematically shows a transverse section of an arm 3 of the piezoelectric resonator, which comprises a groove 4a produced from the upper face of the arm 3 and a groove 4b produced from the lower face of the arm 3. The groove 4a on the upper face is preferably shallower than the depth of the groove 4b on the lower face for an orientation (X, +Y) of the resonator along the crystalline axes, in the case of quartz. A thin bottom wall 13 connecting the lateral walls of the arm is produced at the bottom of the grooves of the arm 3.

Electrodes m1 and m2 are produced on the faces of each arm. These electrodes are generally metal electrodes. A first electrode m1 is produced, for example, on the lateral faces of the arm, whereas a second electrode m2 is produced, for example, in the grooves 4a and 4b. According to this arrangement of the electrodes m1, m2, and the shape of the arm 3 with the grooves 4a, 4b, this forms a type of flat capacitor.

The first electrode m1 is connected to a first electrical connection terminal E1, whereas the second electrode m2 is connected to a second electrical connection terminal E2 in an oscillator circuit. An electrical voltage difference that is variable over time is applied to the terminals E1 and E2 during the operation of the resonator, which generates a variable electric field between the electrodes m1 and m2 at a defined resonant frequency.

Thus, as shown in FIG. 5 and according to the crystalline orientation of the quartz resonator, a stress is generated, since there is a coupling between the electric field and the mechanical stress. Consequently, one of the faces or lateral walls is compressed, whereas the other face or lateral wall is extended, which generates heat. With the thin bottom wall 13, which connects the two lateral walls of the arm 3, this allows thermal relaxation to be attenuated, and thus the thermodynamic losses to be attenuated during the compression of one side and the extension of the other side. Thus, an increase in the quality factor Q is obtained with the adapted depths of the grooves 4a, 4b.

It is also to be noted that the quartz resonator is defined between the two electrical connection terminals E1 and E2 by a resistor in series with a first capacitor and an inductor. A second parasitic capacitor is arranged parallel with the assembly formed by the resistor, the first capacitor and the inductor. The resistor exhibits losses, which must be limited, whereas the first capacitor must have a high value in order to improve the electrical coupling.

Figure 6C:
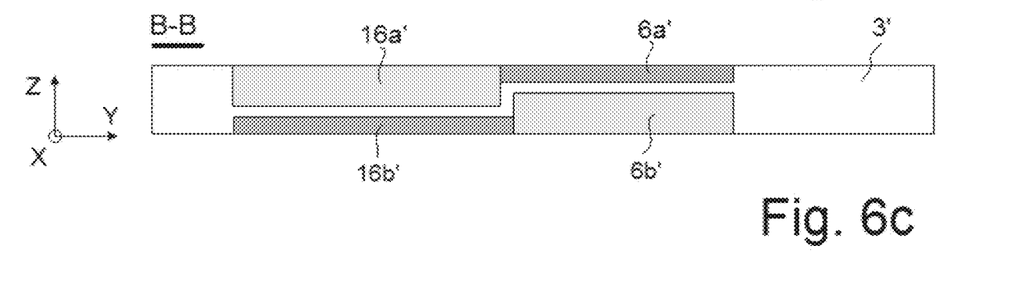

FIG. 6a shows a top view of a piezoelectric resonator 1 with two vibrating arms 3, 3' connected to the base 2 as a variant shown in FIG. 4g. Furthermore, FIGS. 6b and 6c show two longitudinal sections A-A and B-B of first and second elongated portions of one of the arms of the resonator shown in FIG. 6a.

As above-mentioned explained in reference to FIG. 4g, each arm 3, 3' comprises a first elongated portion connected to the base by a connection part. The first elongated portion is parallel to the base 2. Each arm 3, 3' further comprises a second elongated portion parallel to the first portion that is connected to the first elongated portion by a transverse part. The second portion of each arm 3, 3' terminates with a rectangular shaped fin, which symmetrically extends towards the base 2 and is parallel to the connection part.

In FIG. 6a, a first groove 4a, 4a' with a first depth and a first complementary groove 14a, 14a' with a second depth different from the first depth are produced on the upper face of the first portion of each arm 3, 3'. A third groove 6a, 6a' with a second depth and a third complementary groove 16a, 16a' with a first depth different from the second depth are produced on the upper face of the second portion of each arm 3, 3'. Second and fourth grooves and second and fourth complementary grooves further are produced on the lower face of first and second portions of each arm 3, 3' respectively opposite first and third grooves 4a, 4a', 6a, 6a' and first and third complementary grooves 14a, 14a', 16a, 16a' produced from the upper face.

The first groove depth can be selected more than 50% of the total thickness of each arm, and the second groove depth can be selected less than 30% of the total thickness of each arm. Of course, it is possible to contemplate having the first groove depth less than 30% of the total thickness of each arm, and the second groove depth more than 50% of the total thickness of each arm.

FIGS. 6b, 6c show views of longitudinal sections A-A and B-B respectively of the first portion and the second portion of the arm 3'. The first portion comprises the first groove 4a' and the first complementary groove 14a', which form a continuous or segmented groove on the upper face, but with different depths. The first portion further comprises on the lower face a second groove 4b' and a second complementary groove 14b', which form also a continuous or segmented groove on the lower face, but with different depths. The second groove 4b' is produced with a second depth if the first groove 4a' is with a first depth, whereas the second complementary groove 14b' is produced with a first depth if the first complementary groove 14a' is produced with a second depth. In this case, the first depth is more than 50% of the total thickness of the arm 3', whereas the second depth is less than 30% of the total thickness of the arm 3'. So the length of the first groove 4a' has to be smaller than the length of the second groove 4b', whereas the length of the first complementary groove 14a' has to be greater than the length of the second complementary groove 14b'.

The second portion comprises the third groove 6a' and the third complementary groove 16a', which form a continuous or segmented groove on the upper face, but with different depths. The second portion further comprises on the lower face a fourth groove 6b' and a fourth complementary groove 16b', which form also a continuous or segmented groove on the lower face. The fourth groove 6b' is produced with a first depth if the third groove 6a' is with a second depth, whereas the fourth complementary groove 16a' is with the second depth if the third complementary groove 16a' is with a first depth. In this case, the first depth is more than 50% of the total thickness of the arm 3', whereas the second depth is less than 30% of the total thickness of the arm 3' So the length of the third groove 6a' has to be greater than the length of the fourth groove 6b', whereas the length of the third complementary groove 16a' has to be smaller than the length of the fourth complementary groove 16b'.

One advantage to produce this type of grooves on arms 3, 3' of the resonator, is that by adjusting ratio of the lengths of different grooves of portions of each arm, the torsional component of the fundamental bending mode can be modified in order to maximise the quality factor Q independently of the cross-sectional geometrical relations of the arms. This is of particular interest regarding the border widths b, b' and their relation to the groove width e, the arm width l and the arm thickness w, shown in FIGS. 2a and 2b, which may influence the motional capacitance C1, which is the capacitance in the resonance branch as opposed to the static capacitance C0. This technique was found to be particularly efficient for the resonator shown in FIG. 4g, but it can be envisaged to apply a same type of grooves on the arms of the resonators shown in FIGS. 4a to 4g.

By viewing FIG. 6a, it is shown the length of the produced different grooves in particular from the upper face on the two portions of each arm 3, 3'. The first grooves 4a, 4a' with the first complementary grooves 14a, 14a', and the third grooves 6a, 6a' with the third complementary grooves 16a, 16a' are defined with the length references r11, r12, r21, r22. The length reference r11 is for the first grooves 4a, 4a', and the length reference r12 is for the first complementary grooves 14a, 14a'. The length reference r21 is for the third grooves 6a, 6a', and the length reference r22 is for the third complementary grooves 16a, 16a'. The length ratios r12/r11 and r22/r21 can be not equal and are selected in such a manner to optimize the torsional component at the maximum of the quality factor Q as shown on the graph of FIG. 3 and above-mentioned explained.

As shown in FIG. 6a, the lengths r11, r12, r21, r22 can be slightly different on the upper face and also on the lower face for the second and fourth grooves and second and fourth complementary grooves, not shown in FIG. 6a. This is necessary to avoid the penetration of the thin bottom wall 13 at the junction of the grooves produced from the upper face and from the lower face of each arm 3, 3' and as above-mentioned explained in reference to FIGS. 6b and 6c. Furthermore, it can be contemplated separating by a section of reduced depth, not shown, the first grooves 4a, 4a' of the first complementary grooves 14a, 14a', the second grooves of the second complementary grooves, the third grooves 6a, 6a' of the third complementary grooves 16a, 16a', and the fourth grooves of the fourth complementary grooves. In this example shown in FIG. 6a, the grooves are symmetrically arranged with respect to the Y-Z symmetry plane S-S. Of course, it can be envisaged to reverse the depth of the grooves with respect to the Z and Y axis, and as well as with respect to the first and second portions of the arms compared to the situation shown in FIG. 6a. It can be further envisaged to add in continuity at each groove of upper and lower faces of the arms, other complementary grooves of different depth by respecting a depth smaller that 30% or greater than 50% of the thickness of each arm.

Based on the description that has been provided, multiple variations of the piezoelectric resonator can be designed by a person skilled in the art without departing from the scope of the invention defined by the claims. The length of the arms can differ from one to the next. Different shaped grooves can be provided on each arm with depths and/or widths that progressively or incrementally vary over the length of each arm.

What is claimed is:

1. A piezoelectric resonator comprising a base and at least two vibrating arms connected to the base in a direction of a crystalline axis X, wherein the vibrating arms extend from the base in a direction of a crystalline axis +Y or -Y, wherein at least a first groove is formed on an upper face on a side +Z of each arm along the crystalline axis +Y or -Y on part of the length of the arms and wherein at least a second groove is formed on a lower face on a side -Z of each arm along the crystalline axis +Y or -Y on part of the length of the arms and opposite the first groove in an asymmetrical arrangement,
wherein the depth of the first groove is less than 30% of the total thickness of each arm or more than 50% of the total thickness of each arm, and
wherein the depth of the second groove is more than 50% of the total thickness of each arm if the depth of the first groove is less than 30% of the total thickness of each arm, or less than 30% of the total thickness of each arm if the depth of the first groove is more than 50% of the total thickness of each arm.

2. The piezoelectric resonator according to claim 1, wherein the two vibrating arms are connected to the base in a direction of a crystalline axis X, wherein the vibrating arms extend from the base in a direction of a crystalline axis +Y, wherein at least a first groove is formed on an upper face on a side +Z of each arm along the crystalline axis +Y on part of the length of the arms and wherein at least a second groove is formed on a lower face on a side -Z of each arm along the crystalline axis +Y on part of the length of the arms and opposite the first groove in an asymmetrical arrangement,
wherein the depth of the first groove is less than 30% of the total thickness of each arm, and
wherein the depth of the second groove is more than 50% of the total thickness of each arm.

3. The piezoelectric resonator according to claim 2, wherein the depth of the first groove is approximately 25% of the total thickness of each arm, and wherein the depth of the second groove is approximately 65% of the total thickness of each arm.

4. The piezoelectric resonator according to claim 1, wherein the two vibrating arms are connected to the base in a direction of a crystalline axis X, wherein the vibrating arms extend from the base in a direction of a crystalline axis -Y, wherein at least a first groove is formed on an upper face on a side +Z of each arm along the crystalline axis -Y on part of the length of the arms and wherein at least a second groove is formed on a lower face on a side -Z of each arm along the crystalline axis -Y on part of the length of the arms and opposite the first groove in an asymmetrical arrangement,
wherein the depth of the first groove is more than 50% of the total thickness of each arm, and
wherein the depth of the second groove is less than 30% of the total thickness of each arm.

5. The piezoelectric resonator according to claim 4, wherein the depth of the first groove is approximately 65% of the total thickness of each arm, and wherein the depth of the second groove is approximately 25% of the total thickness of each arm.

6. The piezoelectric resonator according to claim 1, wherein the width of each groove is between 40% and 90% of the width of each arm.

7. The piezoelectric resonator according to claim 6, wherein the width of each groove is approximately 42 μm, and wherein the width of each arm is approximately 52 μm.

8. The piezoelectric resonator according to claim 6, wherein each groove is centred on the length of each arm.

9. The piezoelectric resonator according to claim 1, wherein the length of each groove is between 5% and 100% of the length of each arm.

10. The piezoelectric resonator according to claim 9, wherein the length of each groove is approximately 700 μm, and wherein the length of each arm from the base is approximately 1160 μm.

11. The piezoelectric resonator according to claim 10, wherein a space between each arm is 330 µm.

12. The piezoelectric resonator according to claim 1, wherein the resonator is a quartz tuning fork resonator with two arms of the same length from the base, and for which at least two portions of the arms are disposed parallel to each other.

13. The piezoelectric resonator according to claim 1, wherein the base and the two arms are the same thickness.

14. The piezoelectric resonator according to claim 1, wherein the depth and/or the width of each groove varies over the length of each arm.

15. The piezoelectric resonator according to claim 1, wherein the resonator comprises a first elongated portion of each arm connected to the base by a connection part and parallel to the base and a second elongated portion of each arm parallel to the first portion that is connected to the first elongated portion by a transverse part, wherein the resonator comprises the first groove with a first depth and a first complementary groove with a second depth different from the first depth produced on the upper face of the first portion of each arm, wherein it comprises a third groove with a second depth and a third complementary groove with a first depth different from the second depth produced on the upper face of the second portion of each arm, in that it comprises the second groove with a second depth and a second complementary groove with a first depth different from the second depth produced on the lower face of the first portion of each arm respectively opposite the first groove and first complementary groove of the upper face of the first portion of each arm, wherein it comprises a fourth groove with a first depth and a fourth complementary groove with a second depth different from the first depth produced on the lower face of the second portion of each arm respectively opposite the third groove and third complementary groove of the upper face of the second portion of each arm, and wherein the first depth is less than 30% or more than 50% of the total thickness of each arm, and reversely for the second depth.

16. The piezoelectric resonator according to claim 1, wherein the resonator comprises a first elongated portion of each arm connected to the base by a connection part and parallel to the base and a second elongated portion of each arm parallel to the first portion that is connected to the first elongated portion by a transverse part, wherein the resonator comprises the first groove with a first depth and a first complementary groove with a second depth different from the first depth produced on the upper face of the first portion of each arm, wherein it comprises a third groove with a first depth and a third complementary groove with a second depth different from the first depth produced on the upper face of the second portion of each arm, in that it comprises the second groove with a second depth and a second complementary groove with a first depth different from the second depth produced on the lower face of the first portion of each arm respectively opposite the first groove and first complementary groove of the upper face of the first portion of each arm, wherein it comprises a fourth groove with a second depth and a fourth complementary groove with a first depth different from the second depth produced on the lower face of the second portion of each arm respectively opposite the third groove and third complementary groove of the upper face of the second portion of each arm, and wherein the first depth is less than 30% or more than 50% of the total thickness of each arm, and reversely for the second depth.

17. The piezoelectric resonator according to claim 15, wherein other first, second, third and fourth complementary grooves of a first or second depth relative to the thickness of each arm are provided in continuous or by segments of each groove produced on the portions of each arm.

18. The piezoelectric resonator according to claim 16, wherein other first, second, third and fourth complementary grooves of a first or second depth relative to the thickness of each arm are provided in continuous or by segments of each groove produced on the portions of each arm.

* * * * *